United States Patent
Sasaki

[11] Patent Number: 5,912,827
[45] Date of Patent: Jun. 15, 1999

[54] DIGITAL FILTER WITH LOW ROLLOFF FACTOR

[75] Inventor: Eisaku Sasaki, Tokyo, Japan

[73] Assignee: NEC Corporation, Tokyo, Japan

[21] Appl. No.: 08/611,693

[22] Filed: Mar. 6, 1996

[30] Foreign Application Priority Data

Mar. 6, 1995 [JP] Japan .................................. 7-045617

[51] Int. Cl.⁶ .................................................. G06F 17/10
[52] U.S. Cl. ...................................................... 364/724.16
[58] Field of Search ........................ 364/724.16; 375/206

[56] References Cited

U.S. PATENT DOCUMENTS

| | | | |
|---|---|---|---|
| 4,862,403 | 8/1989 | Iwase et al. ........................ | 364/724.16 |
| 5,031,133 | 7/1991 | Sasaki ................................ | 364/724.16 |
| 5,191,547 | 3/1993 | Kawamoto et al. ................. | 364/724.1 |
| 5,193,070 | 3/1993 | Abiko et al. ........................ | 364/724.16 |
| 5,222,035 | 6/1993 | Nakase et al. ...................... | 364/724.16 |
| 5,313,412 | 5/1994 | Nukui ................................. | 364/724.16 |
| 5,383,145 | 1/1995 | Sakiyama et al. .................. | 364/724.16 |
| 5,615,227 | 3/1997 | Schumacher, Jr. et al. ............. | 375/206 |

OTHER PUBLICATIONS

N.K. Bose, "Digital Filters: Theory and Applications", North–Holland, pp. 270–299.

*Primary Examiner*—Emmanuel L. Moise

[57] ABSTRACT

To reduce a circuit scale of an FIR (finite impulse response) type digital filter employed in a hardwared QPSK demodulator, two sets of outputs being symmetrical with each other with respect to a center of shift registers are inputted to sum of products circuits. Then, these outputs are multiplied by the respective tap coefficients, and the multiplied results are added to each other. Furthermore, the added results (containing a multiplied value of a tap coefficient of a center tap in case of even-numbered taps) are summed by an adder to thereby obtain a final result. Since the multiplied results obtained at the respective taps of the rolloff filter for the QPSK modulator, and the added result at the first stage are replaced by 0, or changed by the codes of the tap coefficients, the sum of products circuits may be arranged by two sets of selecting circuits and an exclusive-OR gate circuit for producing selection signals thereof.

8 Claims, 6 Drawing Sheets

| D+$_i$ \ D-$_i$ | 0 | 1 |
|---|---|---|
| 0 | -C$_i$ | 0 |
| 1 | 0 | +C$_i$ |

DIGITAL FILTER WITH LOW ROLLOFF FACTOR

BACKGROUND OF THE INVENTION

1. Field of the Invention

The present invention generally relates to a digital rolloff filter used in a digital radio communication system. More particularly, the present invention pertains to a digital rolloff filter employed in a QPSK (Quadrature Phase Shift Keying) modulator.

2. Description of the Related Art

In a digital microwave communication system, a waveform-shaping filter (rolloff filter) is required in a modulator and a demodulator, respectively. Very recently, digital filters for filtering digital signals on a time base of a base band are practically utilized, since there are great progressive steps in the digital signal processing techniques, the operation speeds of devices, and the higher integration of devices. Thus, digital filters without characteristic fluctuations, aging effects, and also temperature changing problems can be realized.

There are two typical digital filters, i.e., an IIR (Infinite Impulse Response) type digital filter and an FIR (Finite Impulse Response) type digital filter. In the digital microwave communication system, an FIR type digital filter capable of realizing a linear phase is employed.

This conventional FIR type digital filtering system will now be explained with reference to a drawing.

FIG. 1 is a schematic block diagram for representing 1 channel of a QSPK-transmitter end rolloff filter constructed of the conventional FIR type digital filter.

In this rolloff filter, a series of transmit data is inputted into a terminal 81, and passes through a shift register 151 constructed of a plurality of D flip-flops designated by D. The outputs from the respective registers are entered into taps (multipliers) 411 to 416 to be multiplied by tap coefficients. The outputs from the respective taps (multipliers) 411 to 416 are entered into an adder 311 so as to be added with each other. That is, all of the tap outputs are fully added in this adder 311, which is connected to terminal 82. At this time, the sampling values of the impulse responses corresponding to the frequency characteristic of the digital filter become tap coefficients "Cj" of the respective taps (multipliers). Note that symbol "j" indicates integers from −N to N in the case of (2N+1) taps. Assuming now that the data present in the shift register is "ak-j", an output "bk" of the digital filter is given by the following equation (1):

$$bk = \sum_{j=-N}^{N} ak - j \cdot Cj \quad (1)$$

Thus, such a frequency characteristic corresponding to the discrete Fourier transform of the tap coefficient Cj. When the number of taps is increased up to infinite, arbitrary frequency characteristics may be realized.

The above-explained conventional FIR type digital filter is described in various publications, for example, "Digital Filters theory and applications" written by N. K. Bose published by North-Holland.

However, in the case that a sharp or steep frequency characteristic is realized in the FIR type digital filter, the convergence characteristic of the impulse response thereof would be deteriorated. In other words, since the integer N becomes very large in such a manner that the tap coefficient "Cj" becomes negligibly small in fact, a large number of taps would be required. For instance, both the taps (multipliers) Cj and the adder 311 may be arranged by such circuits as shown in FIG. 2 and FIG. 3. That is, since the multipliers of FIG. 2 are 1×n bits multiplication, these multipliers may be realized by employing simple logic gates 571 and 561 to 563. However, since the adder shown in FIG. 3 is arranged by combining (a total tap number—1) pieces of two-input full adders, 361, 362, 363, this circuit arrangement owns a drawback such that when the total tap number is large, the resultant circuit scale would be increased, i.e., bulky circuit arrangement.

To solve this drawback, another conventional method has bee proposed in which the FIR type digital filter is constituted by the ROM. That is, all data "ak-j" present in the shift registers are defined in correspondence with the addresses of the ROM, and an output "bk" of the digital filter with respect to an input signal to this digital filter is previously calculated.

Then this precalculated value is inputted to the data of the ROM, so that the FIR type digital filter may be constituted by employing a single ROM. Moreover, this conventional method has other drawbacks. That is, due to limitations in the operation speed of this ROM and also in the address bit number, this conventional method may be applied only to such a modulator having the rolloff ratio of approximately 0,4, the modulation speed of which is relatively low, and further the band limitations of which is not so severe.

SUMMARY OF THE INVENTION

An object of the present invention is to provide a digital filter having a low rolloff factor and capable of being operable under high modulation speeds.

Another object of the present invention is to provide an FIR type digital filter, the hardwared circuit arrangement of which could be reduced.

To achieve the above-described objects, a digital filter, according to one aspect of the present invention, is comprised of:

2N-bit ("N" being an integer higher than or equal to 2) shift registers for sequentially delaying a series of digital input signals in a sampling interval Ts;

N pieces of sum of products circuits for multiplying as two inputs thereof, an output derived from an i-th ("i" being an integer selected between 1 and N) shift register among said 2N-bit shift registers and another output derived from a (2N+1−i)th shift register among said 2N-bit shift registers by a tap coefficient to obtain multiplied results, and for summing said multiplied results with each other; and an adder for adding as an input thereof, all of summation outputs derived from said N pieces of sum of products circuits to each other.

According to another aspect of the present invention, a digital filter is comprised of:

(2N+1)-bit ("N" being an integer higher than or equal to 2) shift registers for sequentially delaying a series of digital input signals in a sampling interval Ts;

N pieces of sum of products circuits for multiplying as two inputs thereof, an output derived from an i-th ("i" being an integer selected between 1 and N) shift register among said (2N+1)-bit shift registers and another output derived from a (2N-2-i-th shift register among said (2N+1)-bit shift registers by a tap coefficient to obtain multiplied results, and for summing said multiplied results with each other;

a multiplier for multiplying as an input thereof, an output derived from said (N+1)th shift register by a tap coefficient; and an adder for adding as an input thereof, all of summation outputs derived from said N pieces of sum of products circuit to the output derived from said multiplier.

When said two inputs to said sum of products circuits are coincident with each other, said sum of products circuits selectively output a tap coefficient, or a bit-inverted value of said tap coefficient in response to a logic level of said two inputs, whereas when said two inputs are not coincident to each other, said sum of products circuits output 0.

Furthermore, the above described circuits sum of products circuits includes: an exclusive OR gate circuit to which said two inputs are applied; a first selecting circuit for inputting therein a tap coefficient and for selectively outputting said tap coefficient; or a bit-inverted value of said tap coefficient in respond to one of said two inputs; and a second selecting circuit for inputting therein the output from said first selecting circuit and for selectively outputting 0 or the output of said first selecting circuit in response to the output derived from said exclusive OR gate circuit.

BRIEF DESCRIPTION OF THE DRAWINGS

The invention will be more readily understood on reading the following detailed description with reference to the accompanying drawings, in which.

PREFERRED EMBODIMENT OF THE INVENTION

Referring now to drawings, digital filters according to the present invention will be described.

Figure 4:
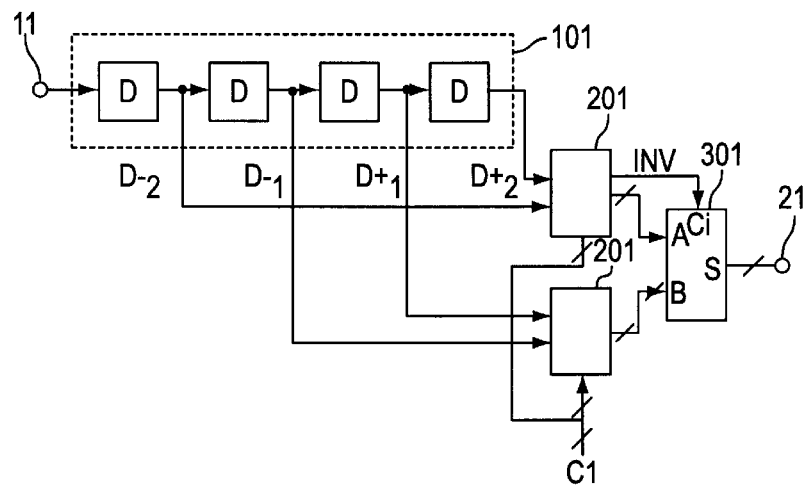
FIG. 4 is a schematic block diagram for showing a circuit arrangement of an FIR type digital filter according to a first embodiment of the present invention.
Figure 5:
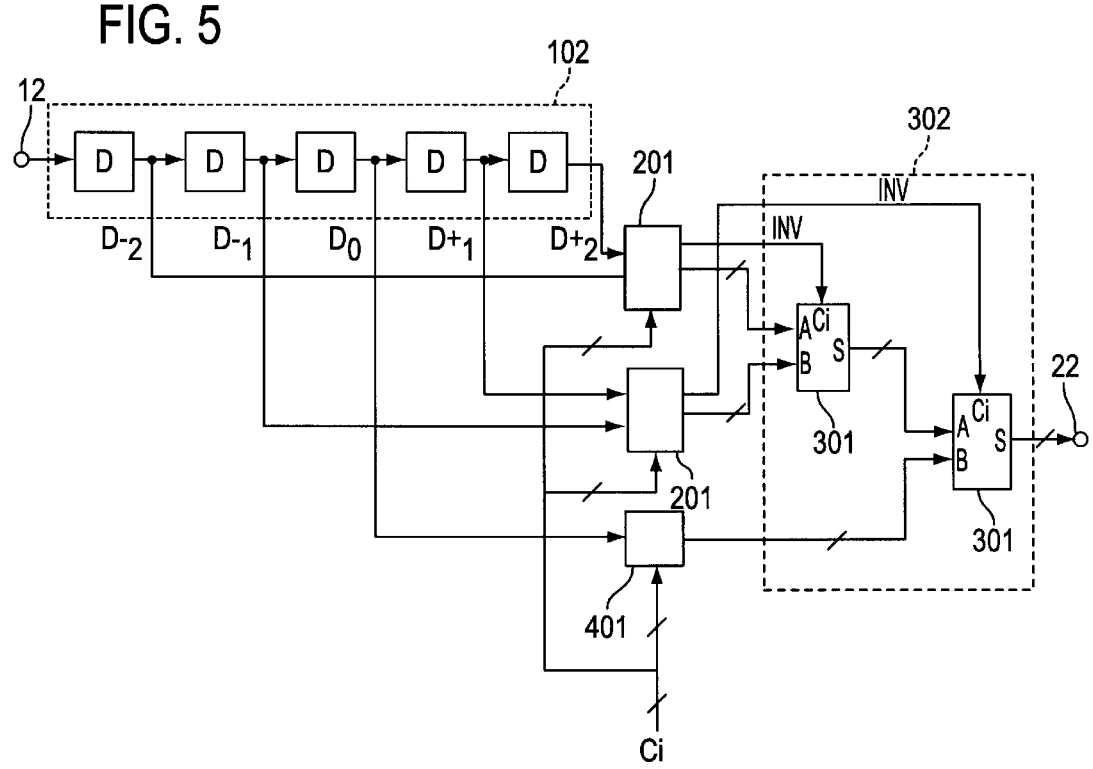
FIG. 5 is a schematic block diagram for showing a circuit arrangement of an FIR type digital filter according to a second embodiment of the present invention.
Figure 6:
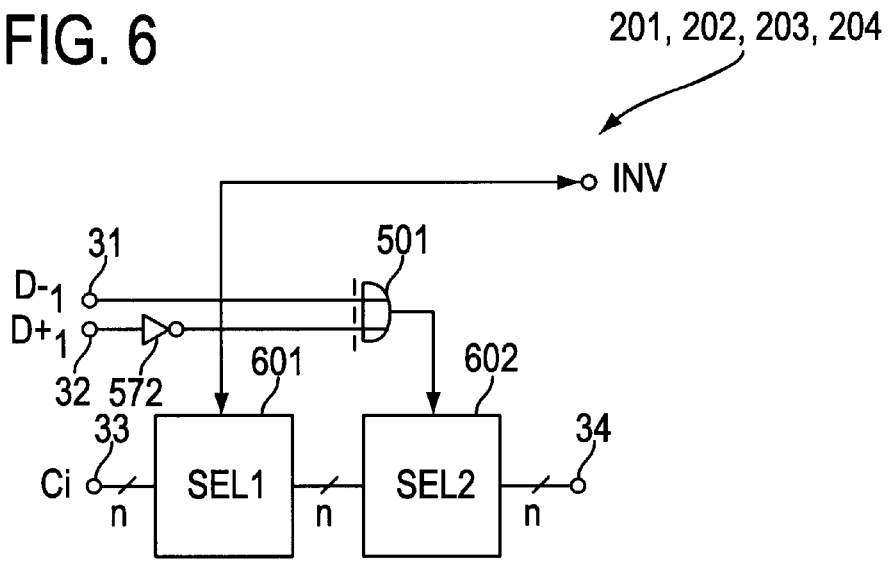
FIG. 6 schematically represents a circuit arrangement of the sum of products circuit shown in FIG. 4 and FIG. 5.

FIG. 4 is a schematic block diagram for indicating a first embodiment of the present invention. In FIG. 4, there is shown a structural example of a digital filter with employment of even-numbered taps, i.e., four taps in this first embodiment. In FIG. 5, there is shown another structural example of a digital filter with employment of oddnumbered taps, i.e., five taps, according to a second embodiment. Further, FIG. 6 shows a schematic block diagram of the sum of products circuit used in each of the circuit blocks of FIG. 4 and FIG. 5.

A first description is made of the circuit arrangement of the FIR type digital filter according to the first embodiment of the present invention, shown in FIG. 4. A series of digital signal inputted from a terminal 11 is entered into a 4-bit shift register 101 driven in response to a clock at a sampling speed. It should be noted that the sampling speed must be selected more than two times higher than the clock speed of the input digital signal based upon the sampling theory, normally is set to two times, or four times higher than power of 2. Assuming now that the respective output signals from the shift register 101 are recognized as D−2, D−1, D+1, and D+2 from the input side, the output signals D−2 and D+2 are inputted into a sum of products circuit 201, whereas the output signals D−1 and D+1 are inputted into another sum of products circuits 202. The sum of products circuit 201 and the sum of products circuit 202 may be realized by way of a circuit shown in FIG. 6. The output signals from the sum of products circuit 201 and the sum of products circuit 202 are entered into an adder 301, and added result thereof is outputted to a terminal 21.

A second description is made of the circuit arrangement of the FIR type digital filter according to the second embodiment of the present invention, shown in FIG. 5. A series of digital signal inputted from a terminal 12 is entered into a 5-bit shift register 102 driven in response to a clock at a sampling speed. It should be noted that this sampling speed is similar to that used in the circuit arrangement of FIG. 4. Assuming now that the respective output signals from the shift register 102 are recognized as D−2, D−1, D0, D+1, and D+2 from the input side, the output signals D−2 and D+2 are inputted into a sum of products circuit 203, the output signal D0 is inputted to a multiplier 401, and the output signals D−1 and D+1 are inputted into another sum of products circuit 204. The sum of products circuit 203 and the sum of products circuit 204 may be realized by way of the circuit shown in FIG. 6. The content of this calculation is similar to that shown in FIG. 4. The multiplier 401 multiplies the input signal D0 by a tap coefficient. The output from the multiplier 401, the output signals from the sum of products circuit 203 and the sum of products circuit 204 are entered into an adder 302, and the added result thereof is outputted to a terminal 22. As can be seen from FIG. 5, the adder 302 includes a first adder 301 and a second adder 301.

Finally, the arrangements of the sum of products circuits 201, 202, 203 and 204 shown in FIG. 6 will now be explained. The n-bit tap coefficient Ci entered into a terminal 33 is inputted into a selecting circuit 601. While using a (D+1) signal inputted from the terminal 32, which is inverted by an inverter 572, as a selection signal, the selecting circuit 601 either directly outputs the tap coefficient Ci or such a signal, all bits of which have been inverted in response to the value of the selection signal. The output signal from this n-bit selecting circuit 601 is inputted into another selecting circuit 602. An inverted (D+i) signal entered from the terminal 32 and another (D−I) signal entered from the terminal 31 are inputted into an EX-OR gate 501. The EX-OR gate 501 outputs a signal which constitutes the selection signal of the selecting circuit 602. In response to the value of the selection signal, the selecting circuit 602 directly outputs the signal entered therein, otherwise outputs an all-bit-0 signal indicative of a value "0" to a terminal 34.

Operations of various circuit portions shown in FIG. 4 will now be described.

Figure 7:
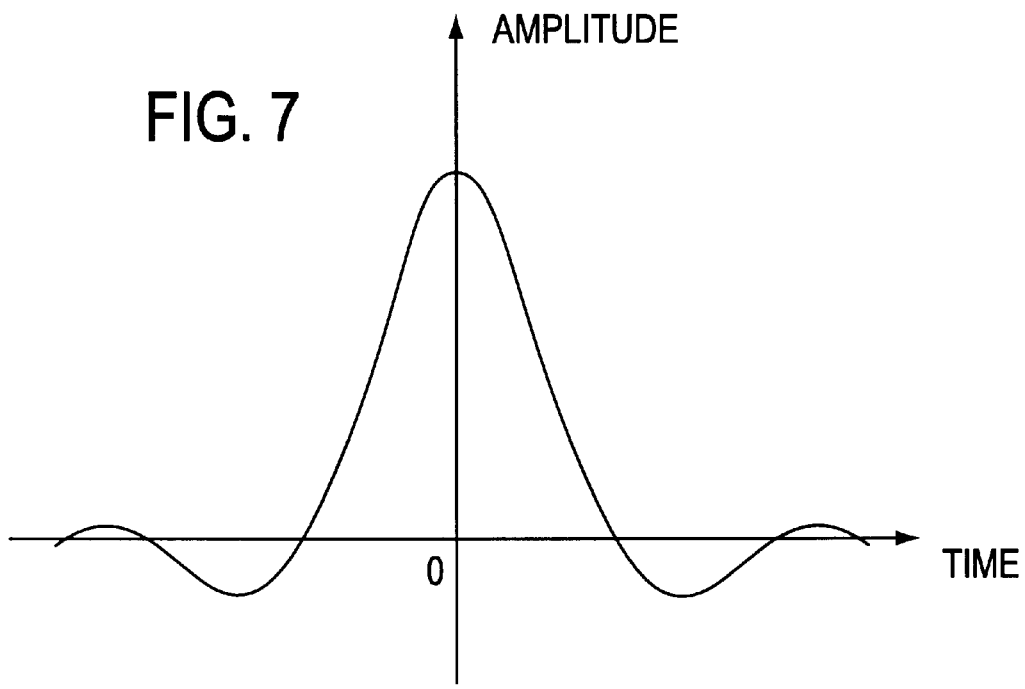
FIG. 7 graphically represents an impulse response of the rolloff filter.

As represented in FIG. 7, an impulse response of the rolloff filter is indicated as a symmetrical form on the time base. Accordingly, the tap coefficient corresponding to the sampling value thereof similarly becomes symmetrical with respect to the center tap. Since the tap coefficient "C+i" has the same value as that of the tap coefficient "C+j", this value is assumed as "Cj". However, in the case of the odd-numbered taps, there is no tap coefficient "C0" as a center.

Figures 8, 9:
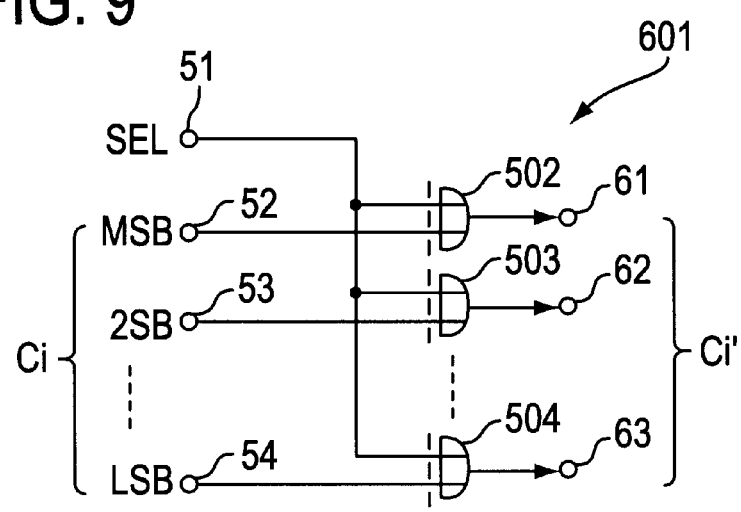
FIG. 8 is a diagram for indicating a relationship between data D+i and data D−i in the shift register.
FIG. 9 is a schematic circuit arrangement of the selecting circuit 601 indicated in FIG. 6.

The sum of products circuit 201 calculates a product between the output D−2 of the shift register 101 and the tap coefficient Cj, and another product between the output D+2 of the shift register 101 and the tap coefficient Cj, and then sums these two products. It should be noted that at this time, the tap coefficient Cj is expressed by a complement of 2 which is suitably added to the subsequent staged circuit. Now, since the modulating system is the QPSK modulating system, the output signal from the shift register 101 corresponds to a 1-bit signal. Assuming now that when this value is "0", this output signal D indicates +½, and when this value is "1", this output signal D indicates +½, the product between the coefficient D and the coefficient Cj becomes any one of −Cj, +Cj, and "0". In other words, two multiplications and the summation of these multiplied results are determined based upon the codes of two Ds, as shown in FIG. 8, and there is no need to execute the calculation. As a consequence, a selection is made as to whether or not the coefficient Cj is inverted by the selecting circuit 601, and subsequently another selection is made as to whether or not this coefficient Cj is set to "0" by the selecting circuit 602.

Figure 1:
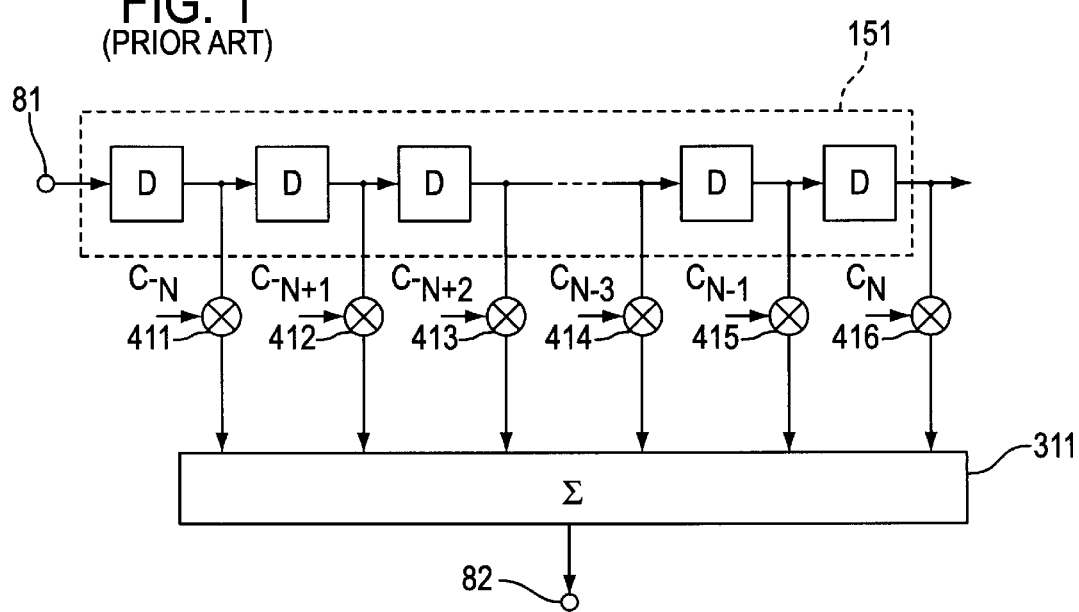
FIG. 1 is a schematic block diagram for representing the arrangement of the conventional FIR type digital filter.
Figure 2:
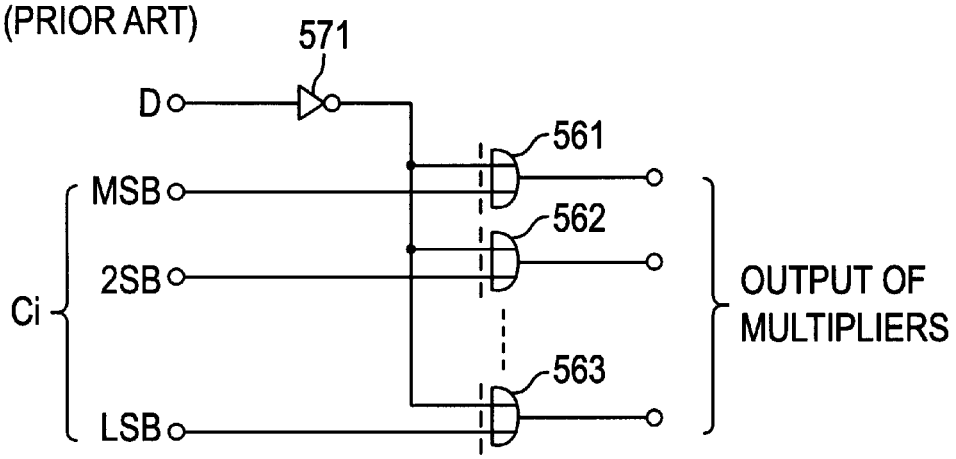
FIG. 2 illustrates the structural example of the taps (multipliers) shown in FIG. 1.
Figure 3:
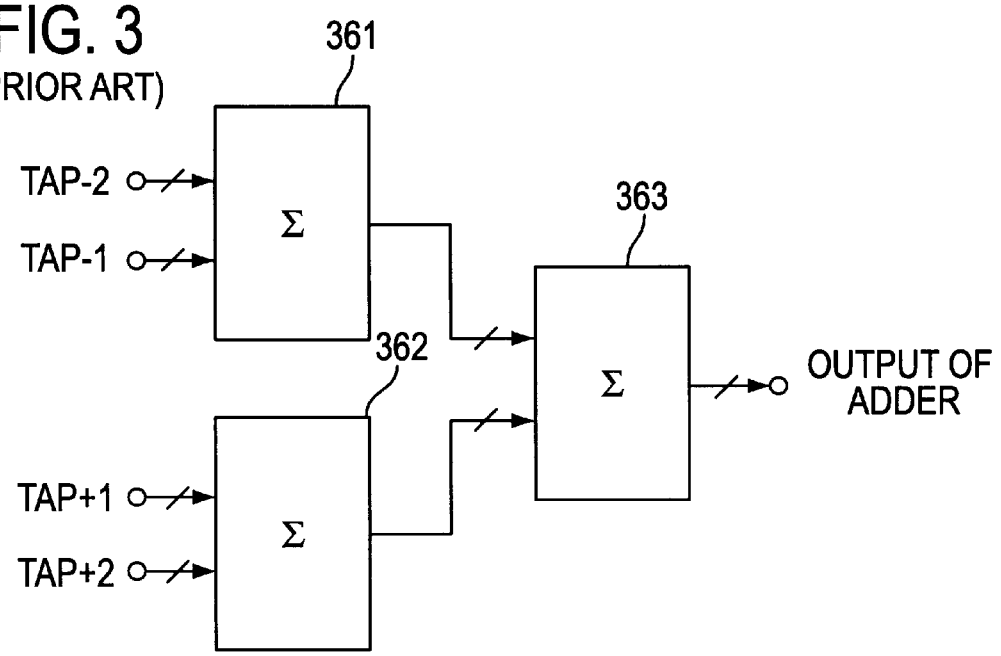
FIG. 3 represents the structural example of the adder 311 shown in FIG. 1.
Figure 10:
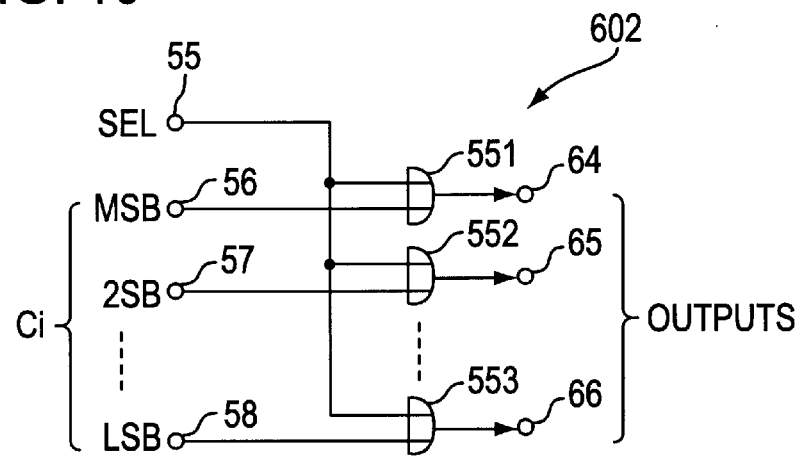
FIG. 10 is a schematic circuit arrangement of the selecting circuit 602 indicated in FIG. 6.

As to the concrete structure of the selecting circuits, the selecting circuit 601 is arranged by a plurality of EX-OR gates 502 to 504 as indicated in FIG. 9. The selector signal (SEC) at a terminal 51 and the taps Ci at terminals 52 to 54 are input to the EX-OR gates 502 to 504. The EX-OR gate outputs are then output to terminals 61 to 63. The selecting circuit 602 is arranged by a plurality of AND gates 551 to 553 as shown in FIG. 10. The selector signal (SEL) at a terminal 55 and the taps Ci' at terminals 56 to 58 are input to the AND gates 551 to 553. The AND gate outputs are input to terminals 64 to 66. As a consequence, the entire circuit scale of the selecting circuits may be reduced, as compared with the conventional selecting circuits arranged by employing the full adder 311, as shown in FIG. 1.

Figure 11:
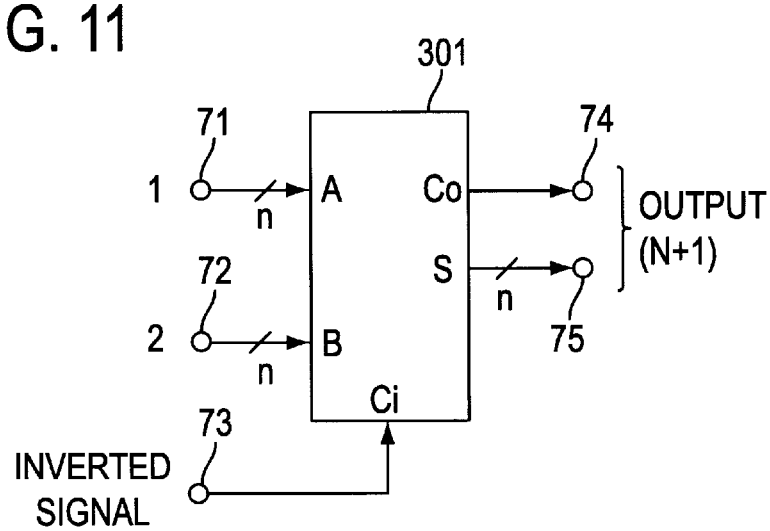
FIG. 11 is a schematic circuit arrangement of the adder 301 shown in FIG. 4.

It should also be noted that when all of bits are inverted, since the coefficient is not inverted by expressing the complement of 2, if the polarity of the coefficient Cj is inverted, then only the value of 1 LSB becomes small. For example, when all bits of "0001" are inverted by 4-bit complement of 2, it becomes "1110", but the true code inversion becomes "1111". This shift may be corrected by entering an inverted signal (i.e., inverted signal (INV) of D+I in FIG. 6) to the post-staged adder 301 shown in FIG. 11 at terminal 73. In FIG. 11, two n-bit signals at terminals 71, 72 are input to the full adder 301, while the inverted signal is input at terminal 73. The sum of the two n-bit signals are then output to terminals 74, 75.

In the case of the odd-numbered taps shown in FIG. 5, the summation between the product output from the sum of products circuit 203 and the product output from the sum of products circuit 204 is carried out in the first adder 301, and the summation between the sum output from the first adder 301 and the product output from the multiplier 401 is performed in the second adder 301. Since the center tap must be individually handled, the multiplier circuit 401 for the center tap is required.

As the tap position is separated from the center tap, since the tap coefficients are rapidly reduced, the essential bit numbers of the tap coefficients are reduced. As described above, the sum of products circuit performs the tap calculation symmetrically with respect to the center, the tap coefficients are identical to each other, and the sum of products circuit can be set to such a circuit scale depending upon the magnitudes of the tap coefficients. As a consequence, the entire circuit scale may be reduced, as compared with such an arrangement that all of the taps are arranged by the same circuits.

In the above-explained digital filter arrangements, the digital filter with employment of the taps is indicated as the even-numbered tap type digital filter, whereas the digital filter with employment of the 5 taps is represented as the odd-numbered tap type digital filter.

However, the present invention is not limited to the above digital filter arrangement, but may be applied to other tap types of digital filters. For instance, in the case of even-numbered taps of 2n (n>2), an output from an i-th shift-register among 2n-bit shift registers and also an output from a (2n+1−i)th shift register thereof are inputted into n sets of sum of products circuits so as to multiply these two inputs by a tap coefficient, and further to sum the multiplied results. Then, all of outputs derived from n sets of sum of products circuits are fully added to each other by combining (n−1) sets of 2-input full adder circuits. As the carry signals inputted to these full adder circuits, the code inverted information of the respective sum of products circuits is entered.

On the other hand, in the case of the off-numbered taps of (2n+1), an output derived from an i-th shift register among (2n+1)-bit shift registers and another output derived from a (2n+2−i)th shift register among them are entered into n sets of sum of products circuits. In these sum of products circuits, two sets of the above-described shift register outputs except for an output from an (n+1)th shift register are multiplied by a tap coefficient, and the multiplied results are added to each other. Further, the output from the (n+1)th shift register is multiplied by the input signal and the tap coefficient in a multiplier. Then, all of the outputs derived from the n sets of sum of products circuits, and also the output derived from the multiplier are fully added with each other by combining n pieces of 2-input full adder circuits. It should also be noted that as the carry signals inputted to these full adder circuits, the code inverted information of the respective sum of products circuits is inputted.

As previously described in detail, according to the digital filter of the present invention, this digital filter can be arranged by combining the multiplier circuit with the first-staged adder circuit, while utilizing the symmetrical characteristic of the tap coefficients. As a consequence, the circuit scale of this digital filter according to the invention could be reduced, as compared with that of the conventional digital filter arranged by the full adders from the first stage to the last stage.

Moreover, the tap coefficients of the taps located apart from the center tap are very small, and the sum of product calculation is carried out with respect to the two taps having the same tap coefficients, so that the circuit scale of the sum of products circuits may be set, namely reduced, depending upon the value of the tap coefficient.

As a consequence, even when the digital filter owns a large number of taps, it is possible to realize such a digital rolloff filter whose entire circuit scale becomes small. In connection to this small circuit scale, the digital rolloff filter may be manufactured with low power consumption and at low costs.

What is claimed is:

1. An FIR (finite impulse response) type digital filter for a digital rolloff filter, comprising:

a 2 N-bit ("N" being an integer higher than or equal to 2) shift register for sequentially delaying a series of digital input signals in a sampling interval Ts;

N pieces of sum of products circuits, each of said sum of products circuits including:
    a first selecting circuit for inputting tap coefficients of said digital filter and selecting whether outputs of said first selection circuit are an inversion of said tap coefficients or not based on an output of said shift register; and
    a second selecting circuit for inputting said outputs of said first selecting circuit and selecting whether outputs of said second selecting circuit are "0" or said outputs of said first selecting circuit based on outputs of said shift register; and
    an adder for adding as an input thereof, all of summation outputs derived from said N pieces of sum of products circuits to each other.

2. A digital filter according to claim 1 wherein:
    when inputs to said sum of products circuits are coincident with each other, said sum of products circuits selectively output a tap coefficient, or a bit-inverted value of said tap coefficient in response to a logic level of said two inputs, whereas when said inputs to sum of products circuits are not coincident to each other, said sum of products circuits output 0.

3. A digital filter according to claim 2 wherein:
    each of said sum of products circuits further includes:
        an exclusive OR gate circuit to which said input are applied;
        said first selecting circuit for inputting therein a tap coefficient and for selectively outputting said tap coefficient, or a bit-inverted value of said tap coefficient in response to a logic level of one of said two inputs; and
        said second selecting circuit for inputting therein the output from said first selecting circuit and for selectively outputting 0 or the output of said first selecting circuit in response to the output derived from said exclusive OR gate circuit.

4. A digital filter according to claim 1 wherein:
    said adder inputs both bit-inverted information outputted from said N pieces of sum of products circuits and the sum of products into (N-1) pieces of full adder circuits so as to combining said bit-inverted information with said sum of products for summation purposes.

5. An FIR (finite impulse response) type digital filter for a digital rolloff filter, comprising:
    a (2N+1) bit ("N" being an integer higher than or equal to 2) shift register for sequentially delaying a series of digital input signals in a sampling interval Ts;
    N pieces of sum of products circuits, each of said sum of products circuits including:
        a first selection circuit for receiving tap coefficients of said digital filter and selecting whether or not outputs of said first selection circuit are an inversion of said coefficients based on outputs of said shift register; and
        a second selection circuit for receiving said outputs of said first selection circuit and selecting whether to output a "0" or said outputs of said first selection circuit based on outputs of said shift register; and
        a multiplier for multiplying as an input thereof, an output derived from said (2N+1) bit shift register by a tap coefficient; and
        an adder for adding as an input thereof, all of summation outputs derived from said N pieces of sum of products circuits to each other.

6. A digital filter according to claim 5 wherein:
    when inputs to said sum of products circuits are coincident with each other, said sum of products circuits selectively output a tap coefficient, or a bit-inverted value of said tap coefficient in response to a logic level of said two inputs, whereas when said inputs to sum of products circuits are not coincident to each other, said sum of products circuits output 0.

7. A digital filter according to claim 6 wherein:
    each of said sum of products circuits further includes:
        an exclusive OR gate circuit to which said inputs are applied;
        said first selecting circuit for inputting therein a tap coefficient and for selectively outputting said tap coefficient, or a bit-inverted value of said tap coefficient in response to a logic level of one of said two inputs; and,
        said second selecting circuit for inputting therein the output from said first selecting circuit and for selectively outputting 0 or the output of said first selecting circuit in response to the output derived from said exclusive OR gate circuit.

8. A digital filter according to claim 5 wherein:
    said adder receives the outputs from said N pieces of sum of products circuits and the output from said multiplier to add all of the inputs by combining N pieces of said full adder circuits with each other.

* * * * *